United States Patent [19]

Boll et al.

[11] Patent Number: 4,507,651
[45] Date of Patent: Mar. 26, 1985

[54] CONTACT-FREE PUSH-BUTTON KEY FOR GENERATING AN ELECTRICAL SIGNAL UPON DEPRESSION THEREOF

[75] Inventors: Richard Boll, Muehlheim; Michael Friedrichs, Hanau, both of Fed. Rep. of Germany

[73] Assignee: Vacuumschmelze GmbH, Fed. Rep. of Germany

[21] Appl. No.: 396,021

[22] Filed: Jul. 7, 1982

[30] Foreign Application Priority Data

Jul. 9, 1981 [DE] Fed. Rep. of Germany ....... 3127053

[51] Int. Cl.³ .............................................. G08C 9/00
[52] U.S. Cl. .................................... 340/365 L; 357/2; 400/479.2
[58] Field of Search ........................ 340/365 L, 365 A; 400/479.2; 324/207, 208; 336/213, 218, 233; 148/108, 121, 31.55; 200/276, 278, 16 A; 357/1, 2, 8

[56] References Cited

U.S. PATENT DOCUMENTS

| 3,735,058 | 5/1973 | Berry | 200/276 |
|---|---|---|---|
| 3,767,878 | 10/1973 | Sykora | 200/276 |
| 3,895,203 | 7/1975 | Leworthy | 200/276 |
| 3,920,943 | 11/1975 | Lapointe | 200/276 |
| 4,028,696 | 6/1977 | Madland | 340/365 L |
| 4,116,728 | 9/1978 | Becker | 148/108 |
| 4,262,233 | 4/1981 | Becker | 148/121 |
| 4,322,973 | 4/1982 | Iwasaki | 73/517 R |

OTHER PUBLICATIONS

Luborsky et al., "Potential of Amorphous Alloys for Application in Magnetic Devices", Journal of Applied Physics, vol. 49, (1978).
Chen, "A Keyswitch Using Extraordinary Hall Effect of Amorphous RE-TM Materials", Xerox Disclosure Journal, vol. 6, No. 6, (1981).
"Sensitive Force Transducers Using a Single Amorphous Core Multivibrator Bridge", K. Mohri et al., IEEE Transactions on Magnetics, vol. MAG-15, No. 6, Nov. 1979, pp. 1806-1808.

Primary Examiner—James J. Groody
Assistant Examiner—Michael F. Heim
Attorney, Agent, or Firm—Hill, Van Santen, Steadman & Simpson

[57] ABSTRACT

A contact-free push-button key for converting mechanical energy into an electrical signal has a toroidal tape core comprised of material having a low magnetic retentivity such as an amorphous metal alloy, the toroidal tape core having an electrical winding thereabout and being deformable upon actuation of a key button thereby inducing a voltage change in the associated winding as a result of the changing magnetic characteristics during deformation. The deformable toroidal core is contained in a housing covered by a slidable push-button key which deforms the core when pressed.

13 Claims, 13 Drawing Figures

CONTACT-FREE PUSH-BUTTON KEY FOR GENERATING AN ELECTRICAL SIGNAL UPON DEPRESSION THEREOF

BACKGROUND OF THE INVENTION

1. Field of the Invention

The present invention relates to a push-button key for generating an electrical signal upon depression thereof, and in particular to such a key which employs no electrical contacts.

2. Description of the Prior Art

The use of a toroidal tape core consisting of amorphous material having a low magnetic retentivity with electrical windings thereabout for connecting multivibrators to the windings in a bridge circuit is described in IEEE Transactions on Magnetics, Vol. MAG-15, No. 6, November 1979 at pages 1806-1808. The toroidal tape core described therein is magnetized by a winding supplied with high frequency alternating current so that an alternating voltage is induced in a secondary winding dependent upon the progression of the hysteresis loop of the toroidal tape core. Upon deformation of the toroidal tape core due to mechanical force, the hysteresis loop becomes flatter, so that a lower voltage is induced in the secondary winding of the core. As a result, the output of the multivibrator is caused to change. The arrangement represents a transducer for converting a mechanical force into an electrical signal.

SUMMARY OF THE INVENTION

It is an object of the present invention to provide a push-button key having no electrical contacts for converting mechanical energy into an electrical signal.

The above object is inventively achieved in a push-button key having a toroidal tape core consisting of an amorphous metal alloy having at least one electrical winding, the toroidal core being deformed upon depression of the key and thereby causing an induced voltage signal. The key may be provided with a detent disposed in proximity to the toroidal tape core so that when deformed the core is pressed against the detent so that a sudden or discontinuous change in the pressure force is necessary for further deformation of the core.

The toroidal core may be contained in a housing mounted to a base plate, the housing slidably receiving a push-button key which, upon depression thereof, causes a deformation of the toroidal core.

DESCRIPTION OF THE PREFERRED EMBODIMENTS

Figure 1:
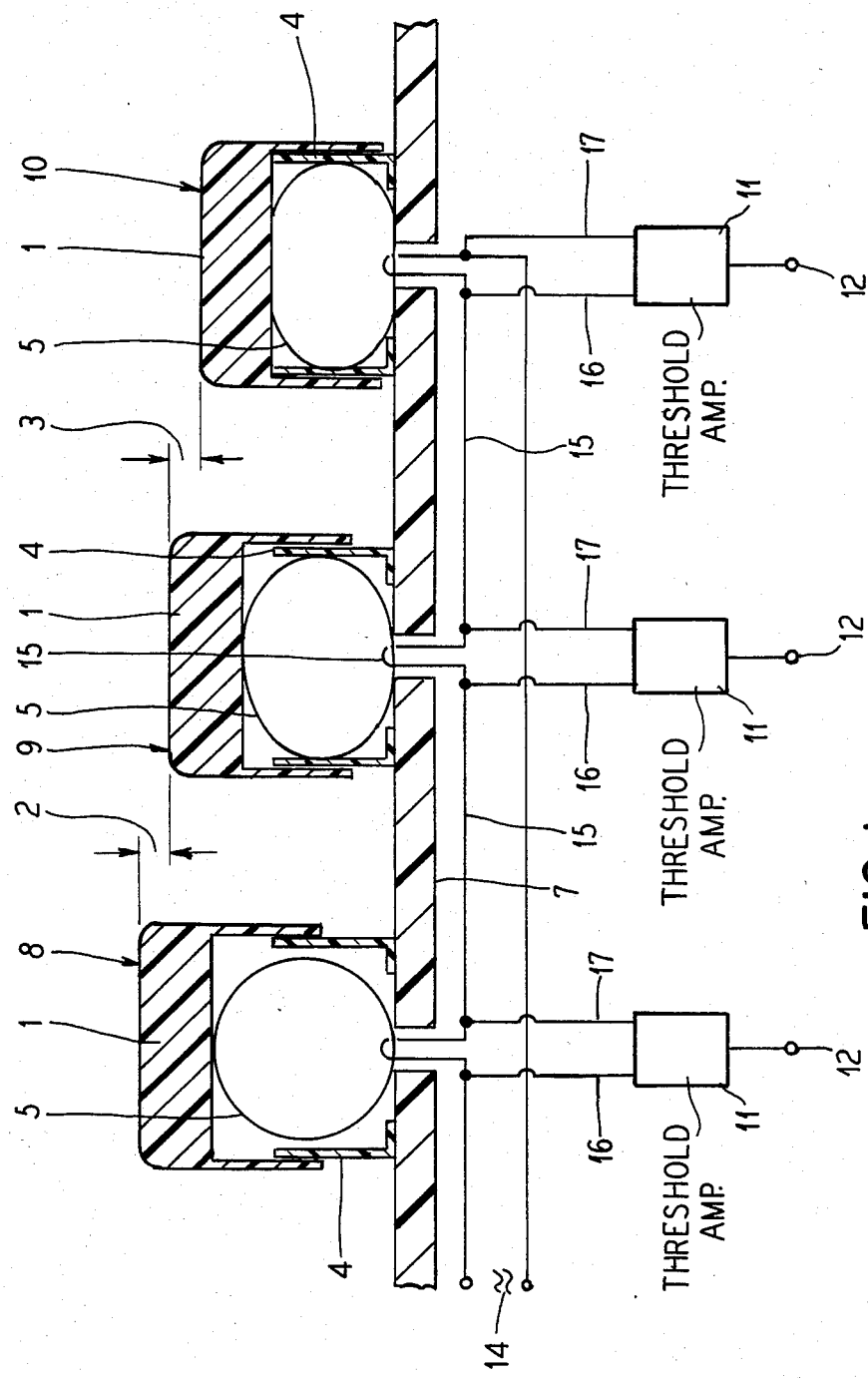
FIG. 1 is a sectional view of a series of keys constructed in accordance with the principles of the present invention depressed by various amounts.

Three keys 8, 9 and 10 constructed in accordance with the principles of the present invention are shown side by side in section in FIG. 1. Each key has a housing 4 secured to a base plate 7. The housing 4 is open at the top and is covered by a depressible push-button 1 which is slidably received over the housing 4. The interior of each key contains a toroidal tape core 5 consisting of amorphous material having a low magnetic retentivity and also exhibiting good spring behavior (resiliency). The toroidal tape core 5 may consist of the following metal alloys quenched from a melt:

$Co_{75}Si_{15}B_{10}$;

$Co_{60}Ni_{17}Si_{14}B_9$;

$Ni_{40}Fe_{40}Mo_2Si_{10}B_8$;

$Fe_{70}Co_{10}B_{20}$.

The keys 8, 9 and 10 each have a push-button 1 depressed by a different amount. The key 8 is in a rest state with its push-button 1 not being depressed. The push-button 1 for the key 9 has traversed a stroke corresponding to the spacing 2. The housing 4 is dimensioned such that when the push-button 1 is depressed by the spacing 2, the toroidal tape core 5 presses against the walls of the housing 4 at both sides. Given further depression of the push-button 1 by an additional spacing 3, as shown in the case of the key 10, the toroidal tape core 5 is deformed with smaller radii of curvature, so that the resistance of the toroidal tape core 5 against depression of the push-button 1 is suddenly or discontinuously increased in the position shown for the key 10 as compared to the position shown for the key 9. As a result, the key has an inherent "center of pressure" without the necessity of additional components to achieve this effect.

The sensor keys 8, 9 and 10 shown in FIG. 1 may be part of a keyboard and are connected to a common winding 15 which is supplied with an alternating current by a high frequency alternating voltage source 14. Each toroidal tape core 5 has a threshold amplifier associated therewith connected to the winding 15 at terminals 16 and 17 in front of and behind each core 5. The threshold amplifiers 11 are set such that upon depression of the push-button 1 by an amount corresponding to the spacing 3, a voltage change occurs at the output 12 of the threshold amplifier 11 representing a signal for an electrical circuit connected thereto, the signal indicating whether the respective key has been depressed or not.

Figure 5:
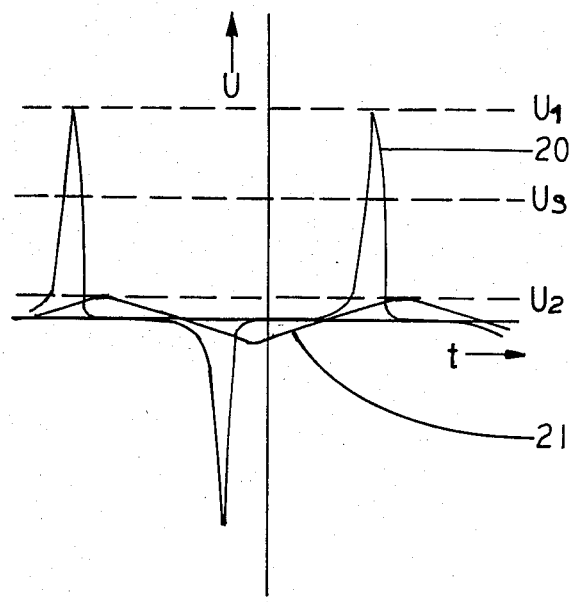
FIG. 5 is a graph of the voltage curve appearing across the winding of a toroidal core in a key constructed in accordance with the principles of the present invention.

A second embodiment of the inventive concept disclosed and claimed herein is shown in FIG. 5 wherein the toroidal tape core 5 simultaneously serves as a magnetic core, as a spring, and as a means for achieving a center of pressure. The keys 8, 9 and 10 are again shown in section in FIG. 2. The toroidal tape core 5 for each key is disposed in a depression or trough 6 in the base plate 7 having a radius of curvature which is greater than the radius of curvature of the core 5 when the core is not deformed. After the push-button 1 has been depressed by the spacing 2 (as shown in key 9) the lower half of the toroidal tape core 5 presses against the depression 6, so that a center of pressure effect again occurs when the key button is further depressed by the spacing 3 (as shown in the key 10).

Figure 2:
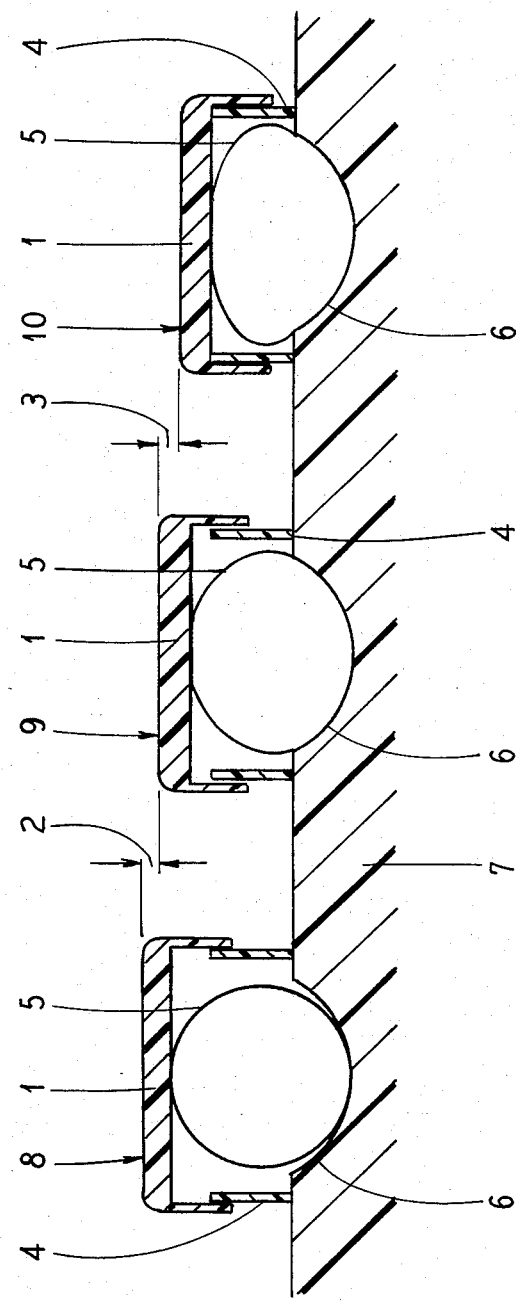
FIG. 2 is a sectional view of a series of keys constructed in accordance with a second embodiment of the present invention depressed by various amounts.
Figure 3:
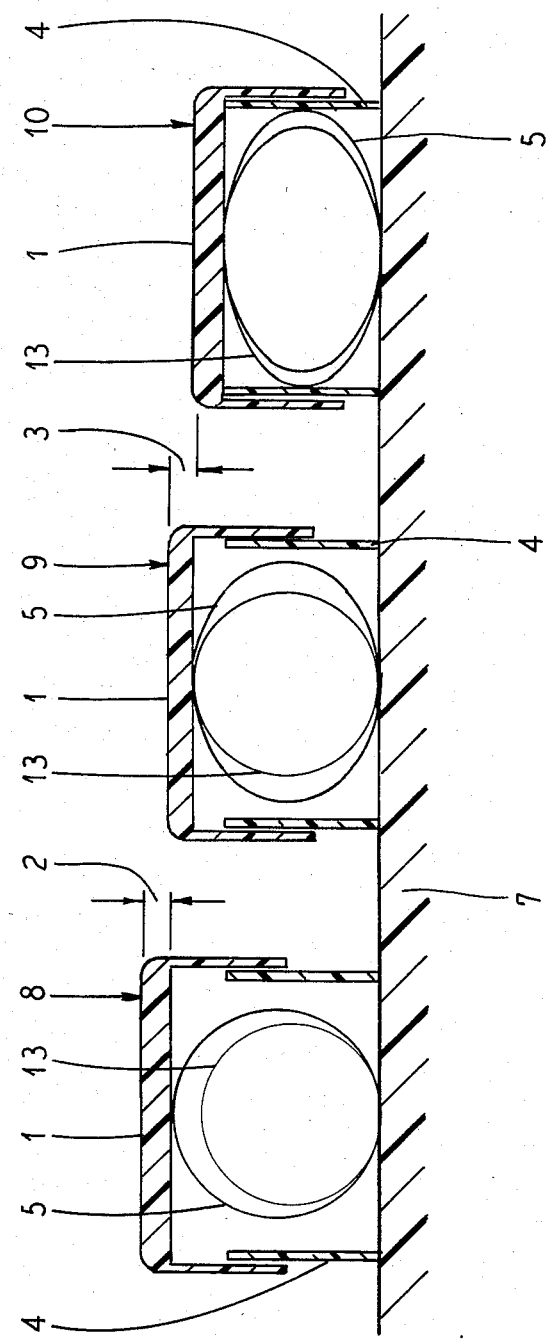
FIG. 3 is a sectional view of a series of keys constructed in accordance with the third embodiment of the present invention depressed by various amounts.

A third embodiment is shown in FIG. 3, which again depicts the keys 8, 9 and 10 in section. In this embodiment two toroidal tape cores 5 and 13 are contained in the housing 4 for each key. The tape cores 5 and 13 have different diameters and may be connected to each other at one location or may be formed by two windings of a single tape consisting of amorphous material. As can be seen in FIG. 3, initially only the outer toroidal tape core 5 is deformed by depression of the push-button 1 by the spacing 2. After this point, both toroidal cores 5 and 13 are deformed so that a different pressure force than in the embodiment shown in FIGS. 1 and 2 is required for depressing the keys.

Figure 4:
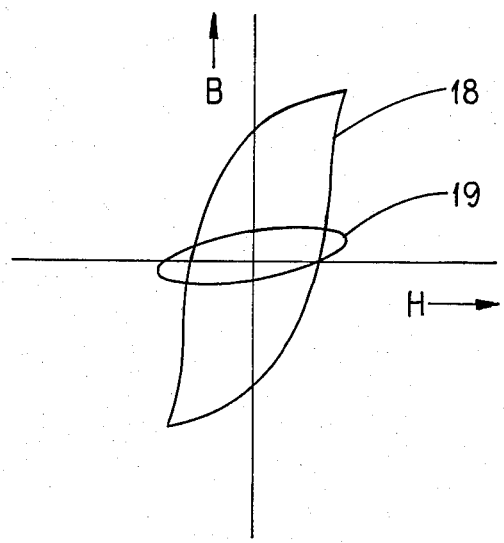
FIG. 4 shows representative hysteresis loops for a key constructed in accordance with the principles of the present invention in a rest state and a depressed state.

A hysteresis loop 18 is shown in FIG. 4 which is representative of a non-deformed toroidal tape core 5. Also shown is the hysteresis loop 19 for the amorphous material which occurs when the push-button 1 is depressed. In both instances, the induction B at a specific alternating current magnetization is plotted with respect to the magnetic field strength H.

A voltage/time diagram (voltage U, time t) is shown in FIG. 5 for the voltage occurring at the input terminals 16 and 17 of the threshold amplifier 11. The curve 20 represents a non-depressed key, which changes to the curve 21 when the push-button 1 is depressed. The maximum voltage associated with a non-depressed push-button 1 is identified in FIG. 5 by the dashed level $U_1$ and the maximum level for a depressed push-button 1 is represented by the dashed line $U_2$. The threshold amplifier 11 may be set so as to switch at, for example, a voltage level corresponding to the dashed line $U_s$.

Two other embodiments within the inventive concept disclosed and claimed herein are respectively shown in FIGS. 6, 7 and 8 and in FIGS. 10, 11 and 12 in which the spring power exerted by the toroidal core 5 upon depression of the push-button 1 along a given path first increases and subsequently decreases to a lower value upon further depression of the push-button 1. In these embodiments, a center of pressure is produced which forces the user of the keyboard to continue to depress the key further up to the detent of the core 5 after passing the maximum range of force.

Figure 6:
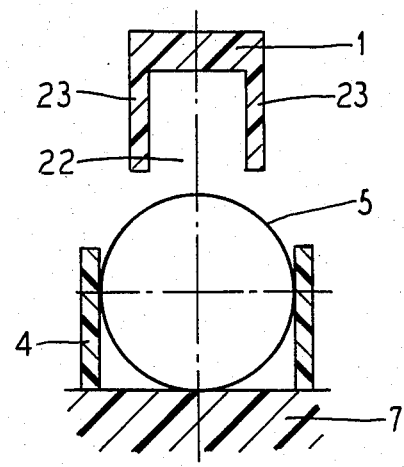
FIGS. 6, 7 and 8 are sectional views of a fourth embodiment of a key constructed in accordance with the principles of the present invention in three stages of actuation.
Figure 7:
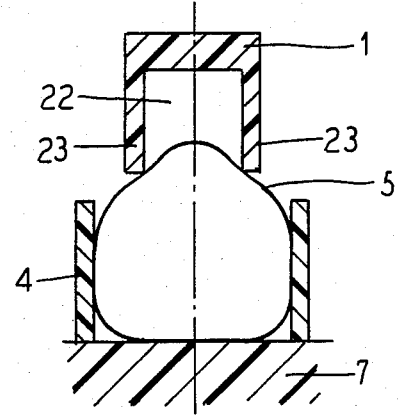
Figure 8:
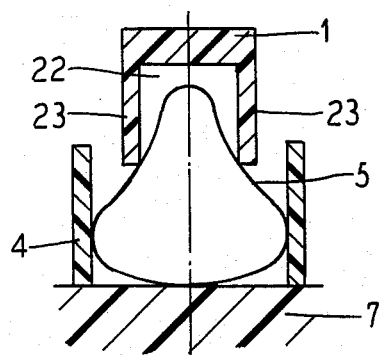

The first of these two embodiments is shown in FIGS. 6, 7 and 8 in various stages of depression. This embodiment also utilizes a housing 4 secured to the base plate 7 for limiting the lateral expansion of the toroidal tape core 5. At a side thereof facing the toroidal tape core 5, the push-button 1 has a channel-like opening 22 which is laterally limited by edges 23. The cross-section of the channel-like opening is shown as a rectangle in the sample embodiment, however the opening may be randomly shaped and need only satisfy the condition that the toroidal tape core 5 be able to slide into the channel-like opening. This embodiment is shown in FIG. 6 in a rest or non-depressed condition, and is shown partially depressed in FIG. 7 to such a degree that the edges 23 are in contact with the toroidal core 5 and such that deformation of the toroidal core has begun, and the embodiment is shown in FIG. 8 after the toroidal core 5 has slid into the channel-like opening 22.

Figure 9:
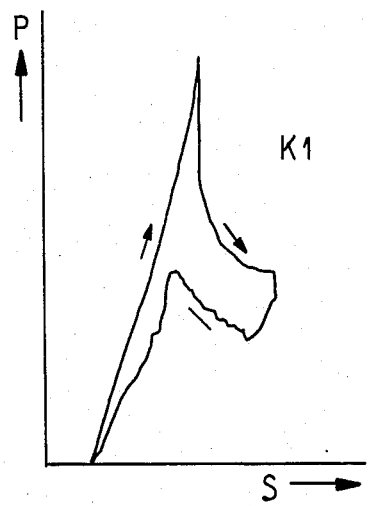
FIG. 9 is a graph plotting the force exerted by the toroidal core on the push-button over the path traveled by the push-button as the push-button is depressed.

A curve K1 measured in a test apparatus according to FIGS. 6 through 8 is shown in FIG. 9 in which the force exerted by the toroidal tape core 5 on the push-button 1 is plotted as a function of the distance traversed or the path S of the push-button 1 as the push-button 1 is depressed and subsequently released. As soon as the edges 23 come into contact with the toroidal tape core 5, the force exerted by the toroidal tape core 5 rises steeply. Because of the friction between the edges 23 and the core 5, that portion of the toroidal tape core 5 situated below the push-button 1 is more greatly deformed than that portion which is situated between the edges 23. Given further depression of the push-button 1 and an increase in the force between the toroidal tape core 5 and the push-button 1, the static friction between the edges 23 and the core 5 is overcome at a specific location of the path S and, because of the value of the sliding friction reduced relative to the static friction, the upper portion of the core 5 slides into the channel-like opening 22. This causes a steep drop of the force exerted by the core 5 on the push-button 1, as can be seen from the curve K1. The forces occurring upon release of the push-button 1 are substantially lower than when the push-button 1 is depressed, because the friction now acts to retain the push-button 1 in the pressed position. Otherwise, a similar force curve as derived during depression of the push-button 1 results, that is, when released the force initially again rises from a lower value and subsequently decreases steeply after passing the maximum which is reached when the toroidal tape core 5 slips out of the channel-like opening 22.

Figure 10:
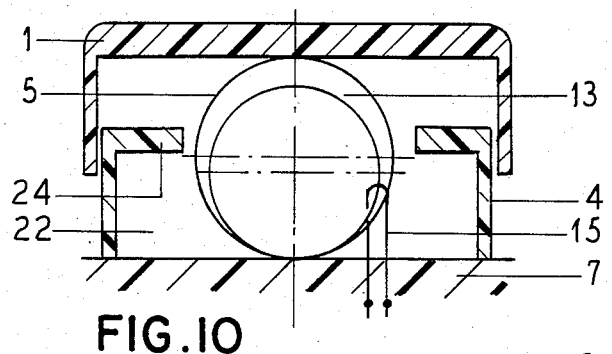
FIGS. 10, 11 and 12 are sectional views of a fifth embodiment of a key constructed in accordance with the principles of the present invention in various stages of depression.
Figure 11:
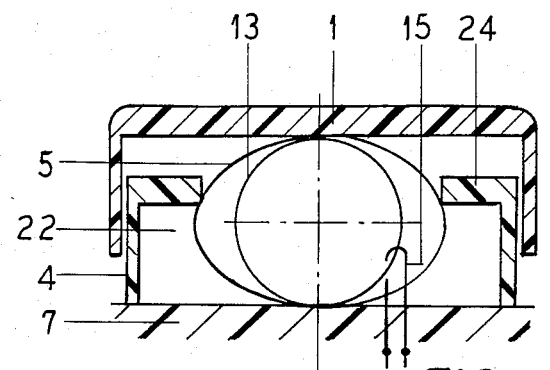
Figure 12:
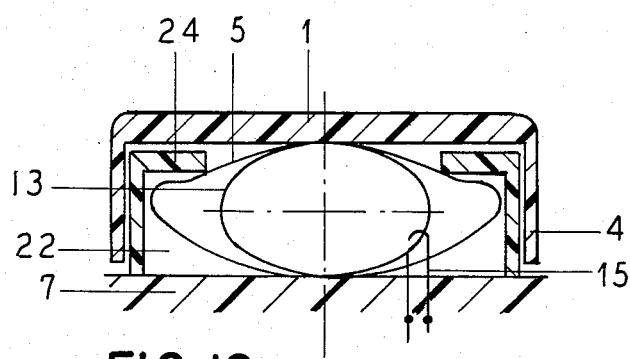
Figure 13:
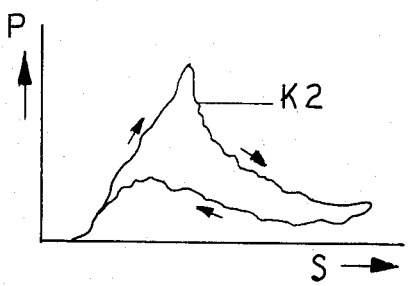
FIG. 13 is a graph plotting the force exerted by the toroidal core on the push-button over the path of the push-button during depression of the push-button.

A second embodiment having a decreasing spring power after passing of a maximum point is shown in FIGS. 10, 11 and 12, respectively showing different positions for the key. In this embodiment the housing 4 has a projection 24 disposed above the center of the toroidal tape core 5 which extends inwardly toward the core 5 and which, in combination with the wall of the housing 4 and the base plate 7, forms a channel-like opening 22 which is open toward the toroidal tape core 5. The difference between the static friction and the sliding friction existing between the core 5 and the projection 24 is utilized, as shown in the curve K2 in FIG. 13, to achieve a decrease in the spring force after an initial increase in the force.

The width of the channel-like opening 22 is the determining factor for the progression of the curves K1 and K2 in both of the embodiments shown in FIGS. 6 through 8 and in FIGS. 10 through 12. If the width is too large, the core may clamp in the opening, so that the friction force dominates over the spring force and a negative force is required for pulling the key up. If the width of the opening is too small, forces which are too large or deformations of the toroidal tape core 5 which are too great may be necessary under certain conditions in order to exceed the maximum value of the force curve. The individual values may be experimentally determined for each particular application of a key in accordance with the principles of the present invention.

As described above, the deformation of the toroidal tape core 5 is exploited both for generating spring power against the push-button 1 and for generating an electrical signal as a result of the changing magnetic properties upon deformation of the core 5. Thus the particular shape of the hysteresis loop for the material comprising the core 5 is not directly dependent upon the spring power which was measured for the graphs shown in FIGS. 9 and 13. Nonetheless, some applications may require both a spring power characteristic curve of the type shown in FIGS. 9 and 13 and a continuous deformation of the toroidal tape core 5 caused by the path of the push-button 1. To this end, as shown in FIGS. 10 through 12, a second toroidal tape core 13 having a diameter smaller than the toroidal tape core 5 may be utilized therewith, and having a winding 15. In such an arrangement, the spring characteristic and the magnetic characteristic of the key over the path S can be set independently of one another.

Although modifications and changes may be suggested by those skilled in the art it is the intention of the inventors to embody within the patent warranted hereon all changes and modifications as reasonably and properly come within the scope of their contribution to the art.

We claim as our invention:

1. A depressible key for generating an electric signal identifying whether the key is in a depressed or non-depressed state comprising:
   a deformable continuous toroidal tape core;
   a means for applying pressure for deforming said core;
   at least one electrically conductive winding extending through said core in which winding said electric signal is generated upon deformation of said core; and
   a means for limiting deformation of said core such that after an initial deformation said core presses against said limiting means and requires a discontinuous change in said pressure for further deformation of said core.

2. The key of claim 1 wherein said means for limiting deformation of said core is a housing surrounding said core and having an open top and wherein said means for applying pressure is a push-button covering said open top of said housing, said housing having dimensions such that said core presses laterally against said housing when said push-button is depressed.

3. The key of claim 1 further comprising a housing surrounding said core and mounted on a base plate and having an open top, and wherein said means for applying pressure is a push-button covering said top of said housing, and wherein said means for limiting deformation of said core is a trough in said base plate disposed opposite said push-button with said core being disposed between said push-button and said trough, said trough having a radius which is larger than the outside radius of said core.

4. The key of claim 1 further comprising an additional toroidal tape core having a smaller diameter than said toroidal tape core and disposed inside said toroidal tape core such that said means for applying pressure initially deforms only said toroidal tape core and subsequently simultaneously deforms both said toroidal tape core and said additional toroidal tape core.

5. The key of claim 1 wherein said winding is part of a common winding connected to a high-frequency alternating voltage source and further extending through respective cores of a plurality of identically constructed keys, and further comprising a threshold amplifier having input terminals connected to said common winding at opposite sides of said core.

6. The key of claim 1 wherein said means for applying pressure is a push-button having a depending channel-like opening having edges in contact with said core when said push-button is depressed, said edges being spaced from one another at a distance which is less than the diameter of said core and for permitting said core to slide into said channel-like opening and freely spread therein during deformation of said core.

7. The key of claim 6 further comprising a housing surrounding said core having an open top covered by said push-button and having dimensions such that said core presses against said housing upon deformation thereof.

8. The key of claim 6 wherein said spacing between said edges of said channel-like opening of said push-button is approximately one half of the diameter of said core.

9. The key of claim 6 further comprising an additional toroidal tape core having a smaller diameter than and disposed inside said toroidal tape core, and a winding surrounding said additional toroidal tape core.

10. The key of claim 1 further comprising a housing surrounding said core and mounted on a base plate and having an open top, said housing having a projection at said top extending inwardly toward said core and disposed a distance from said base plate such that a channel-like opening is formed between said projection and said base plate.

11. The key of claim 10 wherein the spacing between said projection of said housing wall and said base plate is approximately equal to one half the diameter of said core.

12. The key of claim 10 further comprising an additional toroidal tape core having a smaller diameter than and disposed inside said toroidal tape core, and a winding surrounding said additional toroidal tape core.

13. The key of claim 1 wherein said core is comprised of amorphous metal.

* * * * *